US011102898B2

United States Patent
Lee et al.

(10) Patent No.: US 11,102,898 B2
(45) Date of Patent: Aug. 24, 2021

(54) DISPLAY MODULE AND DISPLAY DEVICE

(71) Applicant: SAMSUNG DISPLAY CO., LTD., Yongin-si (KR)

(72) Inventors: Goeun Lee, Yongin-si (KR); Sangmin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 640 days.

(21) Appl. No.: 15/794,133

(22) Filed: Oct. 26, 2017

(65) Prior Publication Data

US 2018/0049339 A1 Feb. 15, 2018

Related U.S. Application Data

(62) Division of application No. 14/595,372, filed on Jan. 13, 2015, now Pat. No. 9,807,898.

(30) Foreign Application Priority Data

Jul. 25, 2014 (KR) .......................... 10-2014-0095005

(51) Int. Cl.
*H05K 5/06* (2006.01)
*B32B 15/04* (2006.01)
(Continued)

(52) U.S. Cl.
CPC ............. *H05K 5/065* (2013.01); *B32B 15/04* (2013.01); *G02F 1/1339* (2013.01);
(Continued)

(58) Field of Classification Search
CPC .... H05K 6/065; H05K 5/0017; H01L 1/5246; H01L 51/5246; B32B 15/04; G02F 1/1339
(Continued)

(56) References Cited

U.S. PATENT DOCUMENTS 7,889,308 B2 2/2011 Jeong
8,258,696 B2 9/2012 Oh et al.
(Continued)

FOREIGN PATENT DOCUMENTS

CN 1658713 A 8/2005
CN 1912717 A 2/2007
(Continued)

OTHER PUBLICATIONS

Extended European Search Report dated Dec. 14, 2015 in Corresponding European Patent Application No. 15174419.0.

*Primary Examiner* — Michael N Orlando
*Assistant Examiner* — Elizabeth Bradford
(74) *Attorney, Agent, or Firm* — Lewis Roca Rothgerber Christie LLP

(57) ABSTRACT

A method of manufacturing a display device includes forming on a first substrate a display element and a metal layer surrounding the display element, the metal layer including a first portion having a first width and a second portion having a second width less than the first width, forming on a second substrate a sealing member surrounding the display element, the sealing member including a first sealing portion having a first forming width and a second sealing portion having a second forming width greater than the first forming width, arranging the first substrate and the second substrate such that the sealing member on the second substrate faces the first substrate, the first sealing portion overlaps the first portion of the metal layer, and the second sealing portion overlaps the second portion of the metal layer, and sealing the first and second substrates by melting and curing the sealing member.

16 Claims, 19 Drawing Sheets

(51) Int. Cl.
*H05K 5/00* (2006.01)
*G02F 1/1339* (2006.01)
*H01L 51/52* (2006.01)
*B32B 37/04* (2006.01)
*G02F 1/1335* (2006.01)

(52) U.S. Cl.
CPC ....... *H01L 51/5246* (2013.01); *H05K 5/0017* (2013.01); *B32B 37/04* (2013.01); *B32B 2457/20* (2013.01); *B32B 2457/202* (2013.01); *B32B 2457/206* (2013.01); *B32B 2457/208* (2013.01); *G02F 1/1335* (2013.01)

(58) Field of Classification Search
USPC ........................................................ 156/272.8
See application file for complete search history.

(56) References Cited

U.S. PATENT DOCUMENTS

| | | | |
|---|---|---|---|
| 8,680,767 | B2 | 3/2014 | Kwon et al. |
| 9,568,776 | B2 | 2/2017 | Nakamura et al. |
| 2005/0184927 | A1 | 8/2005 | Kwak |
| 2007/0030409 | A1 | 2/2007 | Aoki |
| 2007/0171637 | A1 | 7/2007 | Choi |
| 2009/0167155 | A1 | 7/2009 | Kwak |
| 2010/0044692 | A1 | 2/2010 | Kim et al. |
| 2010/0181902 | A1 | 7/2010 | Kita |
| 2011/0018430 | A1 | 1/2011 | Kang et al. |
| 2012/0099061 | A1 | 4/2012 | Lee |
| 2012/0104933 | A1 | 5/2012 | Jung et al. |
| 2012/0319123 | A1 | 12/2012 | Han et al. |
| 2013/0001533 | A1 | 1/2013 | Kim et al. |
| 2013/0164486 | A1 | 6/2013 | Yamada et al. |

FOREIGN PATENT DOCUMENTS

| | | |
|---|---|---|
| CN | 101097364 A | 1/2008 |
| CN | 101728338 A | 6/2010 |
| CN | 102290431 A | 12/2011 |
| CN | 103811528 A | 5/2014 |
| EP | 2 819 203 A2 | 12/2014 |
| GB | 2 450 635 A | 12/2008 |
| JP | 2003-317934 A | 11/2003 |
| JP | 2010-170949 A | 8/2010 |
| KR | 10-0671642 B1 | 1/2007 |
| KR | 10-2008-0003226 A | 1/2008 |
| KR | 10-2010-0022738 A | 3/2010 |
| KR | 10/2011-0008918 A | 1/2011 |
| KR | 10-2012-0044020 A | 5/2012 |
| KR | 10-2013-0007006 A | 1/2013 |
| TW | 200801744 A | 1/2008 |

COMPARATIVE EXAMPLE

DISPLAY MODULE AND DISPLAY DEVICE

CROSS-REFERENCE TO RELATED APPLICATIONS

This is a divisional application based on pending application Ser. No. 14/595,372, filed Jan. 13, 2015, the entire contents of which is hereby incorporated by reference.

Korean Patent Application No. 10-2014-0095005, filed on Jul. 25, 2014, in the Korean Intellectual Property Office, and entitled: "Display Module, Display Device, and Method of Manufacturing the Same," is incorporated by reference herein in its entirety.

BACKGROUND

1. Field

One or more embodiments relate to a display module, a display device, and a method of manufacturing the same.

2. Description of the Related Art

A display module such as a liquid crystal display module or an organic light-emitting display module including a thin-film transistor (TFT) may be applied to a display device for a mobile device such as a smart phone, a tablet personal computer, an ultra-slim notebook, a digital camera, a camcorder, or a portable information terminal or a display device such as an ultra-thin television.

SUMMARY

Embodiments are directed a method of manufacturing a display device including forming on a first substrate at least one display element and a metal layer that surrounds the display element, the metal layer including a first portion having a first width and a second portion having a second width that is less than the first width, forming on a second substrate a sealing member that surrounds the display element, the sealing member including a first sealing portion having a first forming width and a second sealing portion having a second forming width that is greater than the first forming width, arranging the first substrate and the second substrate such that the sealing member that is formed on the second substrate faces the first substrate, the first sealing portion overlaps with the first portion of the metal layer, and the second sealing portion overlaps with the second portion of the metal layer, and forming a display module by melting and curing the sealing member to seal the first and second substrates.

When the sealing member is melted and cured, the first sealing portion may be deformed such that the first sealing portion changes from having the first forming width to having a first sealing width, the second sealing portion may be deformed such that the second sealing portion changes from having the second forming width to having a second sealing width, and a difference between the first sealing width and the second sealing width may be equal to or less than 5% of the first sealing width.

The method may further include disposing the display module in a housing such that the second portion of the metal layer overlaps with at least a part of an antenna.

The sealing member may be formed on the second substrate such that the first forming width of the first sealing portion is less than the first width of the first portion of the metal layer and the second forming width of the second sealing portion is greater than the second width of the second portion of the metal layer.

A first sealing width of the first sealing portion may be greater than the first forming width of the first sealing portion. A second sealing width of the second sealing portion may be greater than the second forming width of the second sealing portion.

When the sealing member is melted and cured, a thickness of the sealing member may be reduced, and a first sealing thickness of the first sealing portion may be less than a second sealing thickness of the second sealing portion.

The sealing member may be melted and cured by a laser beam emitted onto the sealing member.

Embodiments are also directed to a display device including a housing, at least one antenna that is disposed in the housing, and a display module that is disposed in the housing so as to cover the antenna. The display module may include a first substrate on which a display element is located, a second substrate that faces the first substrate, a metal layer that is on the first substrate so as to surround the display element, the metal layer including a first portion having a first width and a second portion having a second width that is less than the first width, and a sealing member that is between the first substrate and the second substrate and surround the display element, the sealing member including a first sealing portion that overlaps with the first portion of the metal layer and has a first sealing width and a second sealing portion that overlaps with the second portion of the metal layer and has a second sealing width. A difference between the first sealing width and the second sealing width of the display module may be equal to or less than 5% of the first sealing width. At least a part of the at least one antenna overlaps with the second portion of the metal layer.

The first and second sealing portions may respectively have first and second sealing thicknesses in a direction from the first substrate to the second substrate. The first sealing thickness of the first sealing portion may be less than the second sealing thickness of the second sealing portion.

A ratio of a width of the first sealing portion that overlaps with the first portion of the metal layer to the first sealing width of the first sealing portion may be greater than a ratio of a width of the second sealing portion that overlaps with the second portion of the metal layer to the second sealing width of the second sealing portion.

The metal layer may further include a connection portion that connects the first portion and the second portion. A width of at least a part of the connection portion may vary.

Respective widths of the first portion and the second portion may be constant.

Embodiments are also directed to a display module including a first substrate on which a display element is located, a second substrate that faces the first substrate, a metal layer that is on the first substrate so as to surround the display element, the metal layer including a first portion having a first width and a second portion that is connected to the first portion and has a second width that is less than the first width, and a sealing member that is between the first substrate and the second substrate so as to surround the display element. The sealing member includes a first sealing portion that overlaps with the first portion of the metal layer and has a first sealing width and a second sealing portion that overlaps with the second portion of the metal layer and has a second sealing width. A difference between the first sealing width and the second sealing width is equal to or less than 5% of the first sealing width.

The first and second sealing portions may respectively have first and second sealing thicknesses in a direction from the first substrate to the second substrate. The first sealing thickness of the first sealing portion may be less than the second sealing thickness of the second sealing portion.

A ratio of a width of the first sealing portion that overlaps with the first portion of the metal layer to the first sealing width of the first sealing portion may be greater than a ratio of a width of the second sealing portion that overlaps with the second portion of the metal layer to the second sealing width of the second sealing portion.

The metal layer may further include a connection portion that connects the first portion of the metal layer and the second portion of the metal layer. A width of at least a part of the connection portion may vary.

Respective widths of the first portion of the metal layer and the second portion of the metal layer may be constant.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
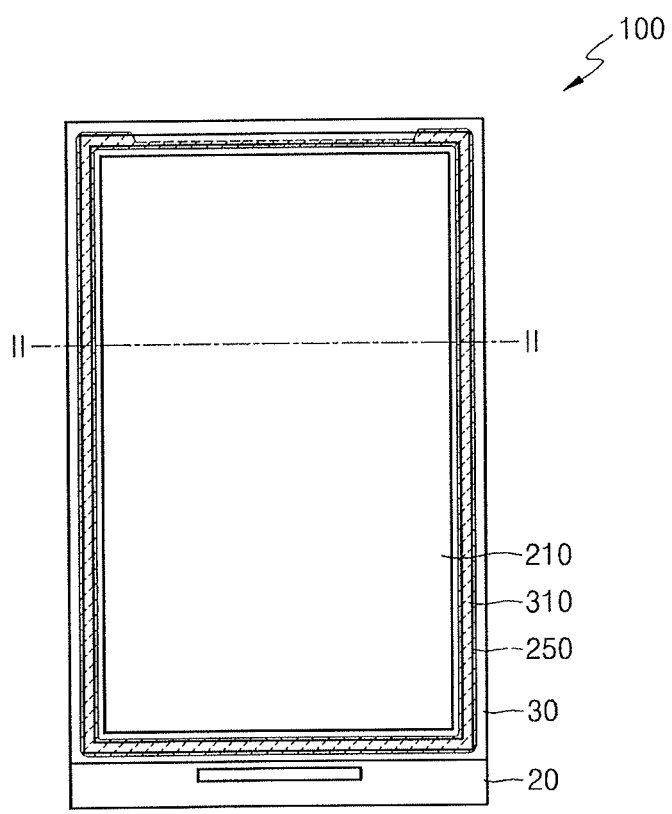
FIG. 1 illustrates a plan view depicting a display module according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", "third", etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise.

When a certain embodiment may be implemented differently, a specific process order may be performed differently from the described order. For example, two consecutively described processes may be performed substantially at the same time or performed in an order opposite to the described order.

Figure 2:
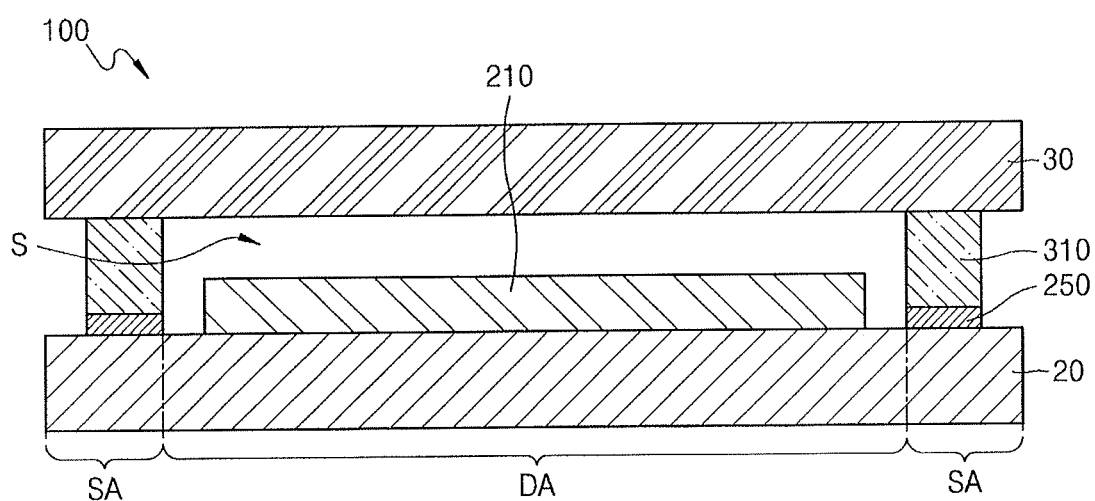
FIG. 2 illustrates a cross-sectional view taken along line II-II of FIG. 1.

FIG. 1 illustrates a plan view depicting a display module 100 according to an embodiment. FIG. 2 illustrates a cross-sectional view taken along line II-II of FIG. 1.

Referring to FIGS. 1 and 2, the display module 100 may include a first substrate 20, a second substrate 30 that is disposed to face the first substrate 20, and a sealing member 310 that is disposed between the first substrate 20 and the second substrate 30 to combine the first substrate 20 and the second substrate 30 with each other.

A display element 210 may be provided on the first substrate 20. The first substrate 20 may be a stiff glass substrate, a polymer substrate, or a flexible film, a metal substrate, or a composite substrate thereof. The display element 210 is a display element such as an organic light-emitting diode (OLED) element, a liquid crystal display (LCD) element, or an electrophoretic display element that forms an image.

The second substrate 30 may be a transparent member. An image that is formed by the display element 210 may be exposed to the outside through the second substrate 30. In some embodiments, the second substrate 30 may further include an on-cell touch screen panel on which a touch screen pattern is formed, in order to function as a touch panel.

A polarization film, a color filter, or a protective window (not shown) may be further provided on the second substrate 30.

The sealing member 310 may be disposed between the first substrate 20 and the second substrate 30 to surround the display element 210 and seal an internal space S between the first substrate 20 and the second substrate 30. The sealing member 310 may prevent oxygen or moisture from permeating into the internal space S in which the display element 210 is formed. The sealing member 310 may increase a mechanical strength by stably bonding the first substrate 20 and the second substrate 30. A moisture absorbent or a filling material may be provided in the internal space S between the first substrate 20 and the second substrate 30.

The sealing member 310 may be an inorganic material. For example, the sealing member 310 may be a glass frit. The sealing member 310 may be formed using a coating method such as dispensing or screen printing. The term "glass frit" generally refers to a glass raw material in the form of powder, as an example. For example, the glass frit may be provided in the form of paste obtained by adding a laser or infrared absorber, an organic binder, and a filler for reducing a thermal expansion coefficient to a main material such as $SiO_2$. A laser beam may be applied to the sealing member 310, and thus, the sealing member 310 may be melted and cured, to secure the first substrate 20 and the second substrate 30.

A metal layer 250 for increasing a bonding strength of the sealing member 310 may be provided between the sealing member 310 and the first substrate 20.

Figure 3:
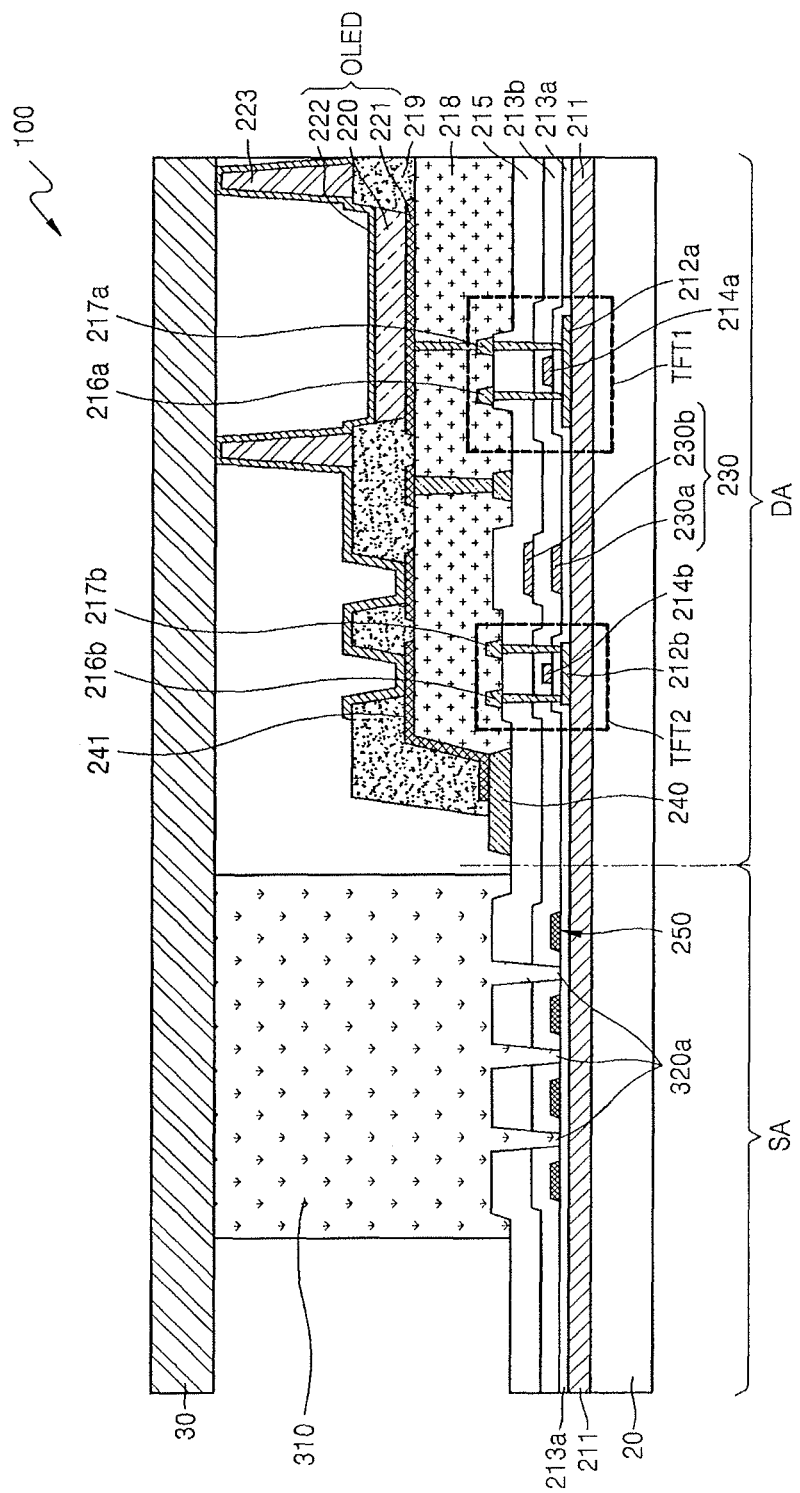
FIG. 3 illustrates a detailed cross-sectional view depicting a sealing structure of the display module of FIG. 1.

FIG. 3 illustrates a detailed cross-sectional view depicting a sealing structure of the display module 100 of FIG. 1.

Referring to FIG. 3, the display module 100 may include the first substrate 20, the second substrate 30, and the sealing member 310 that is disposed between the first and second substrates 20 and 30. The display module 100 may include a display area DA that displays an image and a sealing area-SA that seals the display area DA.

A buffer layer 211 may be further provided on the first substrate 20. The buffer layer 211 may prevent impurity ions from being diffused from a top surface of the first substrate 20, may prevent moisture or external air from permeating into the first substrate 20, and may planarize the top surface of the first substrate 20. In some embodiments, the buffer layer 211 may be formed of an inorganic material such as silicon oxide, silicon nitride, silicon oxynitride, aluminum oxide, aluminum nitride, titanium oxide, or titanium nitride, an organic material such as polyimide, polyester, or acryl, or a stack thereof. The buffer layer 211 may be omitted if desired. The buffer layer 211 may be formed by a suitable deposition method such as plasma-enhanced chemical vapor deposition (PECVD), atmospheric pressure CVD (APCVD), or low-pressure CVD (LPCVD).

The display element 210 for forming an image is disposed in the display area DA. The display element 210 may be an OLED, an LCD element, or an electrophoretic display element. As an example, the display element 210 is illustrated as an OLED in FIG. 3.

A first thin-film transistor (TFT) TFT1 may include a first active layer 212a, a first gate electrode 214a, a first source electrode 216a, and a first drain electrode 217a. A first gate insulating film 213a for insulating the first gate electrode 214a and the first active layer 212a may be disposed between the first gate electrode 214a and the first active layer 212a. The first gate electrode 214a may be formed on the first gate insulating film 213a to overlap with a part of the first active layer 212a. The first TFT TFT1 may be disposed under the OLED, and may be a driving TFT for driving the OLED.

A second TFT TFT2 may include a second active layer 212b, a second gate electrode 214b, a second source electrode 216b, and a second drain electrode 217b. The first gate insulating film 213a for insulating the second gate electrode 214b and the second active layer 212b may be disposed between the second gate electrode 214b and the second active layer 212b. The second gate electrode 214b may be formed on the first gate insulating film 213a to overlap with a part of the second active layer 212b.

The first active layer 212a and the second active layer 212b may be provided on the buffer layer 211. The first active layer 212a and the second active layer 212b may be formed of an organic semiconductor or an inorganic semiconductor such as amorphous silicon or polysilicon. In some embodiments, the first active layer 212a may be formed of an oxide semiconductor. For example, the oxide semiconductor may include an oxide selected from group 12, 13, and 14 metal elements such as zinc (Zn), indium (In), gallium (Ga), tin (Sn), cadmium (Cd), germanium (Ge), and hafnium (Hf), and a combination thereof.

The first gate insulating film 213a may be provided on the buffer layer 211 to cover the first active layer 212a and the second active layer 212b. A second gate insulating film 213b is formed to cover the first gate electrode 214a and the second gate electrode 214b.

Each of the first gate electrode 214a and the second gate electrode 214b may include a single-layer film, such as gold (Au), silver (Ag), copper (Cu), nickel (Ni), platinum (Pt), palladium (Pd), aluminum (Al), molybdenum (Mo), or chromium (Cr), a multi-layer film, or an alloy such as Al:Nd or Mo:W.

Each of the first gate insulating film 213a and the second gate insulating film 213b may include an inorganic film such as silicon oxide, silicon nitride, or metal oxide, and may be formed to have a single-layer structure or a multi-layer structure thereof.

An interlayer insulating film 215 may be formed on the second gate insulating film 213b. The interlayer insulating film 215 may be formed of an inorganic film such as silicon oxide or silicon nitride. The interlayer insulating film 215 may include an organic film.

The first source electrode 216a and the first drain electrode 217a may be formed on the interlayer insulating film 215. Each of the first source electrode 216a and the first drain electrode 217a may contact the first active layer 212a through a contact hole. The second source electrode 216b and the second drain electrode 217b may be formed on the interlayer insulating film 215, and each of the second source electrode 216b and the second drain electrode 217b may contact the second active layer 212b through a contact hole. Each of the first source electrode 216a, the second source electrode 216b, the first drain electrode 217a, and the second drain electrode 217b may include a metal, an alloy, a metal nitride, a conductive metal oxide, or a transparent conductive material.

In other implementations, the first and second TFTs TFT1 and TFT2 may have other suitable structures. For example, although FIG. 2 shows each of the first and second TFTs TFT1 and TFT2 as having a top gate structure, in other implementations, each of the first and second TFTs TFT1 and TFT2 may have a bottom gate structure in which the first gate electrode 214a is disposed under the first active layer 212a.

A capacitor 230 may be included in the display area DA. The capacitor 230 may function to store a data signal that is applied to the display element 210 or to compensate for a voltage drop of the display element 210.

The capacitor 230 may include a first capacitor electrode 230a, a second capacitor electrode 230b, and the second gate insulating film 213b, which is disposed between the first capacitor electrode 230a and the second capacitor electrode 230b. The first capacitor electrode 230a may be formed of the same material as that of the second gate electrode 214b, and the second capacitor electrode 230b may be formed of the same material as that of the first gate electrode 214a.

A planarization film 218 may be provided on the interlayer insulating film 215 to cover the first and second TFTs TFT1 and TFT2 and the capacitor 230. The planarization film 218 may perform planarization by removing any stepped portion in order to improve the luminous efficiency of the OLED that is to be formed on the planarization film 218. The planarization film 218 may have a through-hole through which a part of the first drain electrode 217a is exposed.

The planarization film 218 may be formed of an insulating material. For example, the planarization film 218 may have a single-layer structure or a multi-layer structure formed of an inorganic material, an organic material, or a combination thereof, and may be formed by a suitable deposition method. In some embodiments, the planarization film 218 may be formed of at least one material selected from a polyacrylate resin, an epoxy resin, a phenolic resin, a polyamide resin, a polyimide resin, an unsaturated polyester resin, a poly-phenylene ether resin, a poly-phenylene sulfide resin, and benzocyclobutene (BCB).

Any one of the planarization film 218 and the interlayer insulating film 215 may be omitted if desired.

The OLED may be disposed on the planarization film 218, and includes a first electrode 221, an intermediate layer 220 including an organic emission layer, and a second electrode 222. A pixel defining film 219 may be disposed to cover parts of the planarization film 218 and the first electrode 221. The pixel defining film 219 may define a pixel area PA and a non-pixel area NPA.

Holes and electrons injected from the first electrode 221 and the second electrode 222 of the OLED may recombine with each other in the organic emission layer of the intermediate layer 220 to generate light.

The intermediate layer 220 may include the organic emission layer. In some implementations, the intermediate layer 220 may further include various functional layers. For example, the intermediate layer 220 may further include at least one selected from a hole injection layer (HIL), a hole transport layer (HTL), an electron transport layer (ETL), and an electron injection layer (EIL).

The second electrode 222 may be formed on the intermediate layer 220. The second electrode 222 may form an electric field with the first electrode 221 such that light is emitted from the intermediate layer 220. The first electrode 221 may be patterned for each pixel, and the second electrode 222 may be formed such that a common voltage is applied to all pixels. The second electrode 222 may be electrically connected through a circuit wiring 241 to a power wiring 240 that is disposed on an edge of the display area DA.

Each of the first electrode 221 and the second electrode 222 may be a transparent electrode or a reflective electrode. The first electrode 221 may function as an anode and the second electrode 222 may function as a cathode. In other implementations, the first electrode 221 may function as a cathode and the second electrode 222 may function as an anode.

Although only one OLED is shown in FIG. 3, the display area DA may include a plurality of the OLEDs. Each of the OLEDs may form one pixel, and each pixel may generate red, green, blue, or white color.

A protective layer (not shown) may be disposed on the second electrode 222 and may cover and protect the OLED. The protective layer may include an inorganic insulating film and/or an organic insulating film.

A spacer 223 may be disposed between the first substrate 20 and the second substrate 30 to maintain an interval between the first substrate 20 and the second substrate 30. The spacer 223 may be provided to prevent display characteristics from degrading due to external impact.

In some embodiments, the spacer 223 may be provided on the pixel defining film 219. The spacer 223 may protrude from the pixel defining film 219 toward the second substrate 30. In some embodiments, the pixel defining film 219 and the spacer 223 may be integrally formed with each other by using photolithography or a photo process using a photosensitive material. In this case, the pixel defining film 219 and the spacer 223 may be simultaneously formed by adjusting an exposure dose through an exposure process using a halftone mask.

The second electrode 222 and/or the protective layer may be disposed on the spacer 223.

The sealing member 310 that surrounds the display element 210 may be disposed in the sealing area SA. The sealing area SA in which the first substrate 20 and the second substrate 30 are bonded to each other may prevent oxygen or moisture from permeating into the display area DA.

The metal layer 250 for improving the bonding performance of the sealing member 310 may be provided in the sealing area SA. The metal layer 250 may be disposed between the sealing member 310 and the first substrate 20. For example, the metal layer 250 may be disposed on the first substrate 20 to surround the display element 210.

In order to combine the first and second substrates 20 and 30, a laser beam may be emitted to the sealing member 310. When the laser beam is emitted to the sealing member 310, the metal layer 250 may reflect the laser beam and heat may be transferred to a lower portion of the sealing member 310. A bonding strength of the sealing member 310 may be increased by enabling the heat transferred due to the laser beam to be sufficiently transferred to the lower portion as well as to an upper portion of the sealing member 310.

A plurality of openings 320a for assisting bonding of the sealing member 310 may be formed in the sealing area SA. A contact area of the sealing member 310 may be increased due to the openings 320a.

The plurality of openings 320a may be formed to pass through the metal layer 250, the second gate insulating film 213b, and the interlayer insulating film 215. In other implementations, the openings 320a may be formed to pass through at least one selected from the metal layer 250, the second gate insulating film 213b, and the interlayer insulating film 215. The openings 320a may be omitted if desired.

Figure 4:
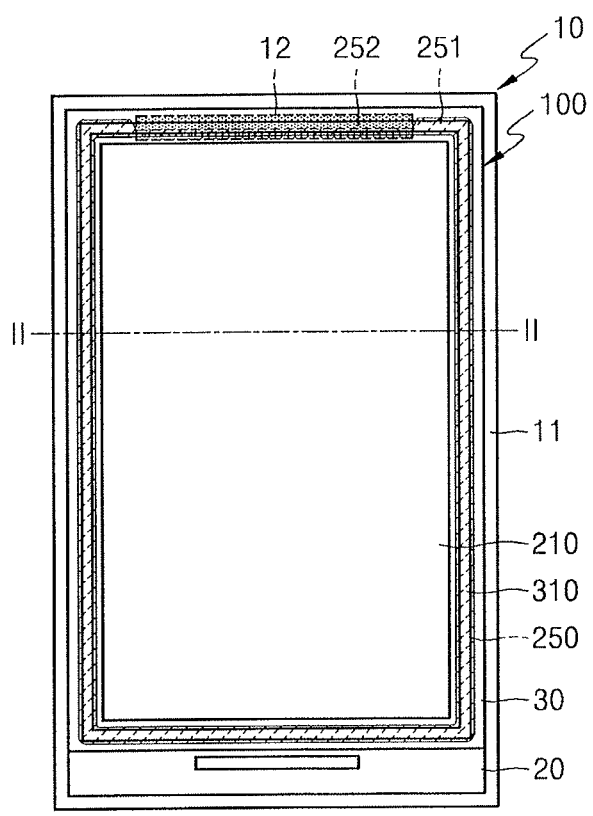
FIG. 4 illustrates a plan view depicting a display device according to an embodiment.

FIG. 4 illustrates a plan view depicting a display device 10 according to an embodiment. Referring to FIG. 4, the display device 10 may include a housing 11, at least one antenna 12 that is disposed in the housing 11, and the display module 100.

The housing 11 may form an outer appearance of the display device 10. The housing 11 may be a single member or may include a plurality of members that may be coupled to one another. The antenna 12 and the display module 100 may be disposed in the housing 11. Various elements such as a battery, a main board, a camera, a speaker, and a bracket may be disposed between the housing 11 and the display module 100.

The number of the antenna(s) 12 that is(are) disposed in the housing 11 may be one, or two or more. The antenna 12 for transmitting and/or receiving a wireless signal may be formed by using single or multi-band antennas. Examples of communication bands that may be covered by the antenna 12 include cellular phone bands (e.g., 850 MHz, 900 MHz, 1800 MHz, 1900 MHz, or 2100 MHz bands), satellite navigation bands (e.g., 1575 MHz bands for satellite positioning systems), wireless local area network bands (e.g., 2.4 GHz or 5 GHz bands for IEEE 802.11 (WiFi®)), or Bluetooth bands (e.g., 2.4 GHz bands). Examples of the antennas that may be used for the antenna 12 in the housing 11 include monopole antennas, dipole antennas, strip antennas, patch antennas, inverted-F antennas, coil antennas, planar inverted-F antennas, open slot antennas, closed slot antennas, loop antennas, hybrid antennas including a plurality of types of antennas, or other appropriate antennas.

The display module 100 may be disposed in the housing 11 to cover the antenna 12. The metal layer 250 may improve bonding characteristics of the display module 100 but may affect a reception sensitivity of the antenna 12 according to a position of the metal layer 250 with respect to the antenna 12. For example, when the metal layer 250 is disposed to overlap with the antenna 12, a reception sensitivity of the antenna 12 may be reduced according to a width of the metal layer 250.

In the display module 100 of FIG. 4, in order not to reduce a reception sensitivity of the antenna 12 even when the metal layer 250 is disposed to overlap with the antenna 12, a width of a part of the metal layer 250 may be provided to be less than that of other parts.

Figure 5:
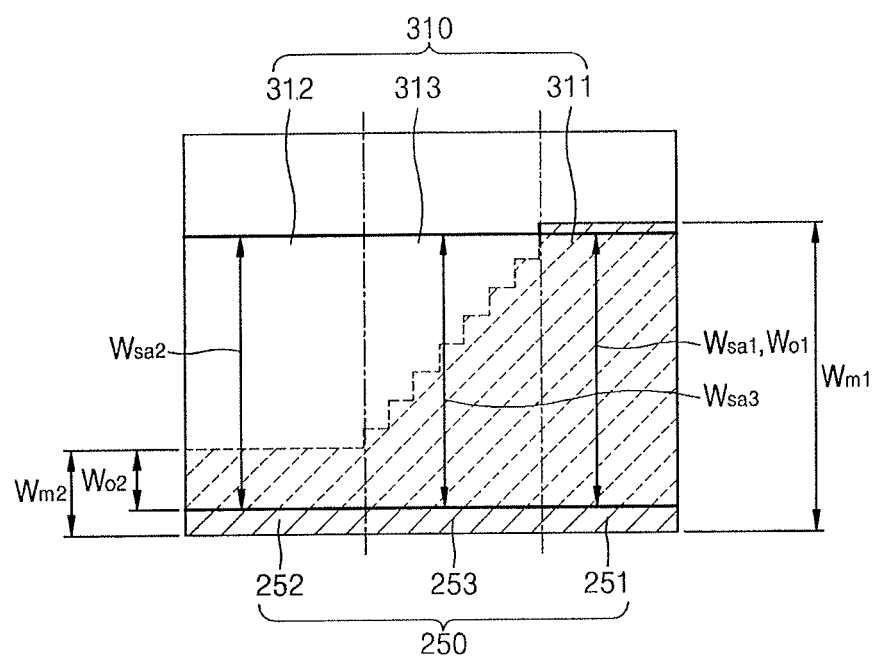
FIG. 5 illustrates an enlarged view depicting a part of the display module of FIG. 4.

FIG. 5 illustrates an enlarged view depicting a part of the display module 100 of FIG. 4. Referring to FIGS. 4 and 5, the metal layer 250 may include a first portion 251 having a first width $W_{m1}$ and a second portion 252 having a second width $W_{m2}$ that is less than the first width $W_{m1}$. The first and second portions 251 and 252 may have constant widths. The second width $W_{m2}$ may range from about 15% to about 45% of the first width $W_{m1}$. For example, when the first width $W_{m1}$ of the metal layer 250 is 700 μm, the second width $W_{m2}$ of the metal layer 250 may be 200 μm.

The display module 100 may be disposed in the housing 11 such that the second portion 252 having the second width $W_{m2}$ that is less than the first width $W_{m1}$ overlaps with at least a part of the antenna 12. Accordingly, the antenna 12 may stably transmit and receive a signal through the second portion 252. A reduction in reception sensitivity of the antenna 12 that is disposed in the housing 11 may be prevented or lessened.

The metal layer 250 may further include a connection portion 253 that is disposed between the first portion 251 and the second portion 252. The first portion 251 may have the first width $W_{m1}$ that is constant, the second portion 252 may have the second width $W_{m2}$ that is constant, and at least a part of the connection portion 253 may have a width that is variable. For example, a width of the connection portion 253 may be reduced stepwise in a direction away from the first portion 251 toward the second portion 252.

In the above embodiments, the first portion 251 and the second portion 252 may have linear shapes. The second portion 252 may be connected to the bottom of the first portion 251 through the connection portion 253. However, as long as the second width $W_{m2}$ of the second portion 252 is less than the first width $W_{m1}$ of the first portion 251, an arrangement and a connection method of the first portion 251 and the second portion 252 may be modified in various ways.

Figure 6A:
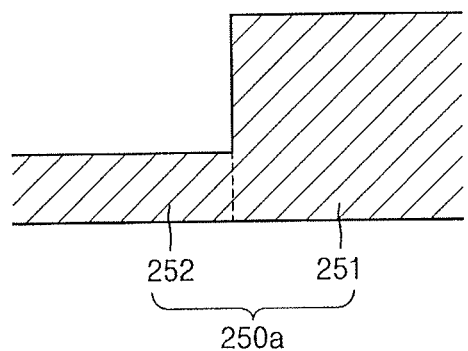
FIGS. 6A through 6E illustrate cross-sectional views depicting modifications of a metal layer of FIG. 5.
Figure 6B:
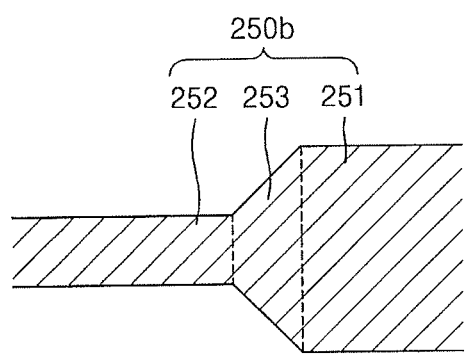
Figure 6C:
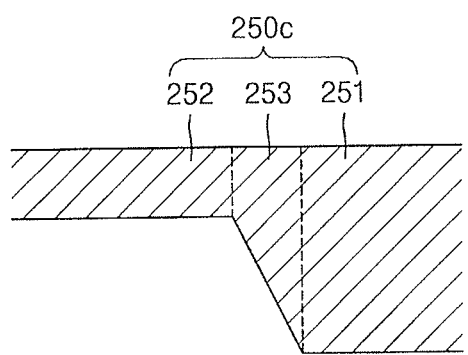
Figure 6D:
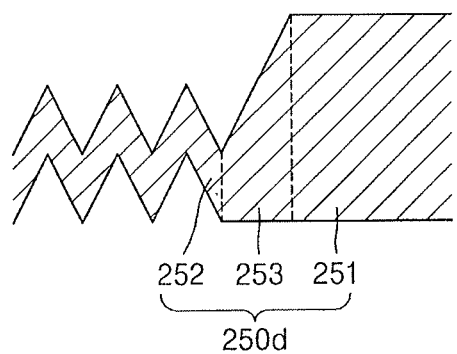
Figure 6E:
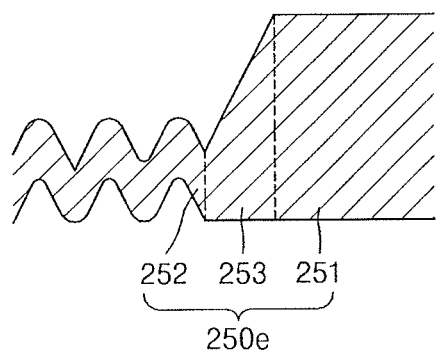

FIGS. 6A through 6E illustrate cross-sectional views depicting modifications of the metal layer 250 of FIG. 5. The second portion 252 may be directly connected to the first portion 251 without the connection portion 253 as shown in FIG. 6A. A position at which the second portion 252 is connected to the first portion 251 through the connection portion 253 may change. For example, the second portion 252 may be connected to a middle portion of the first portion 251 through the connection portion 253 as shown in FIG. 6B, or may be connected to an upper portion of the first portion 251 as shown in FIG. 6C. A width of the connection portion 253 may linearly vary as shown in FIGS. 6B and 6C. The second portion 252 may have a zigzag shape as shown in FIG. 6D or may have a waveform as shown in FIG. 6E.

Referring back to FIG. 5, the sealing member 310 may be disposed on the metal layer 250 to overlap with the metal layer 250. The sealing member 310 may include a first sealing portion 311 that overlaps with the first portion 251 and has a first sealing width $W_{sa1}$ and a second sealing portion 312 that overlaps with the second portion 252 of the metal layer 250 and has a second sealing width $W_{sa2}$. The sealing member 310 may further include a connection sealing portion 313 that is connected to the first sealing portion 311 and the second sealing portion 312 and has a third sealing width Wsa3. The term 'sealing width' used herein refers to a width of the sealing member 310 after being completely cured.

When the display module 100 is manufactured, a state of the sealing member 310 may change. For example, after the sealing member 310 is formed on the second substrate 30, the sealing member 310 may be melted and cured by a laser beam. A state of the sealing member 310 that is formed on the second substrate 30 and a state of the sealing member 310 that is completely cured may be different from each other. The sealing member 310 may have a forming width when the sealing member 310 is formed on the second substrate 30 and may have a sealing width that is different from the forming width when the sealing member 310 is completely cured. The sealing width of the sealing member 310 may be greater than the forming width of the sealing member 310.

The amount of change in a width according to a state of the sealing member 310, for example, a difference between the forming width and the sealing width, may vary according to a width of the metal layer 250 that overlaps with the sealing member 310. For example, as a width of the metal layer 250 that overlaps with the sealing member 310 increases, the amount of change in a width of the sealing member 310 during a melting and curing process may increase. As a width of the metal layer 250 increases, the amount of heat that is reflected by the metal layer 250 to a lower portion of the sealing member 310 while a laser beam is emitted may increase.

The first width $W_{m1}$ of the first portion 251 may be greater than the second width $W_{m2}$ of the second portion 252. Accordingly, a width by which the first sealing portion 311 and the metal layer 250 overlap with each other may be greater than a width by which the second sealing portion 312 and the metal layer 250 overlap with each other. When the sealing member 310 is melted and cured by emitting a laser beam, the amount of change in a width of the sealing member 3410 may be greater in the first sealing portion 311 than in the second sealing portion 312.

According to the display module 100 of the present embodiment, in consideration of the amount of change in a width of the sealing member 310 due to the metal layer 250 during a melting and curing process using a laser beam, the forming width of the sealing member 310 may be determined so that the sealing width of the sealing member 310 satisfies a predetermined range in all portions.

A method of manufacturing the display module 100 including an operation of forming the sealing member 310 so that the sealing width of the sealing member 310 satisfies a predetermined range will now be explained with reference to FIGS. 7A through 7D.

FIGS. 7A through 7D illustrate plan views to explain a method of manufacturing the display module 100 of FIG. 1.

Figure 7A:
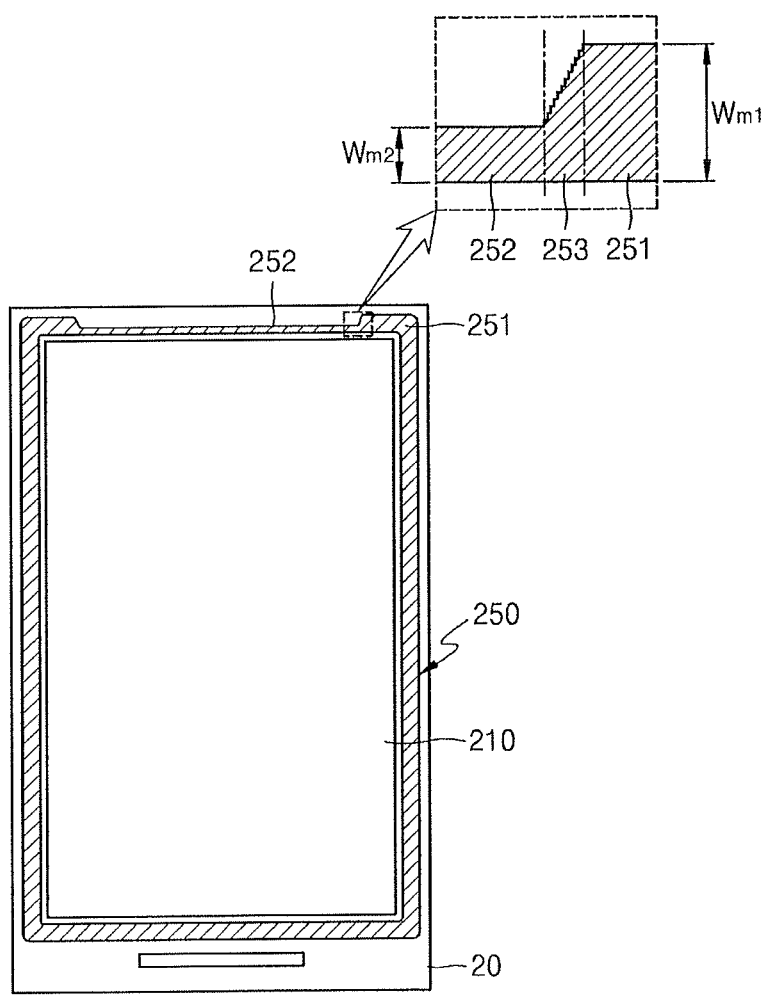
FIGS. 7A through 7D illustrate plan views to explain a method of manufacturing the display module of FIG. 1.

Referring to FIG. 7A, the display element 210 and the metal layer 250 that surrounds the display element 210 may be formed on the first substrate 20.

The display element 210 may include the OLED, the first TFT TFT1, and the second TFT TFT2.

The metal layer 250 may include the first portion 251, the second portion 252, and the connection portion 253 that connects the first and second portions 251 and 252. The metal layer 250 may be formed so that the second width $W_{m2}$ of the second portion 252 is less than the first width $W_{m1}$ of the first portion 251. A width of the connection portion 253 may decrease away from the first portion 251 toward the second portion 252.

The metal layer 250 may be formed of the same material as that of the first gate electrode 214a of the first TFT TFT1 on the same plane as that of the first gate electrode 214a of the first TFT TFT1. In other implementations, the metal layer 250 may be formed of the same material as that of the second gate electrode 214b of the second TFT TFT2 on the same plane as that of the second gate electrode 214b of the second TFT TFT2. In some embodiments, the metal layer 250 may be a single-layer film or a multi-layer film including Au, Ag, Cu, Ni, Pt, Pd, Al, Mo, or Cr. In some embodiments, the metal layer 250 may include an alloy such as Al:Nd or Mo:W.

Figure 7B:
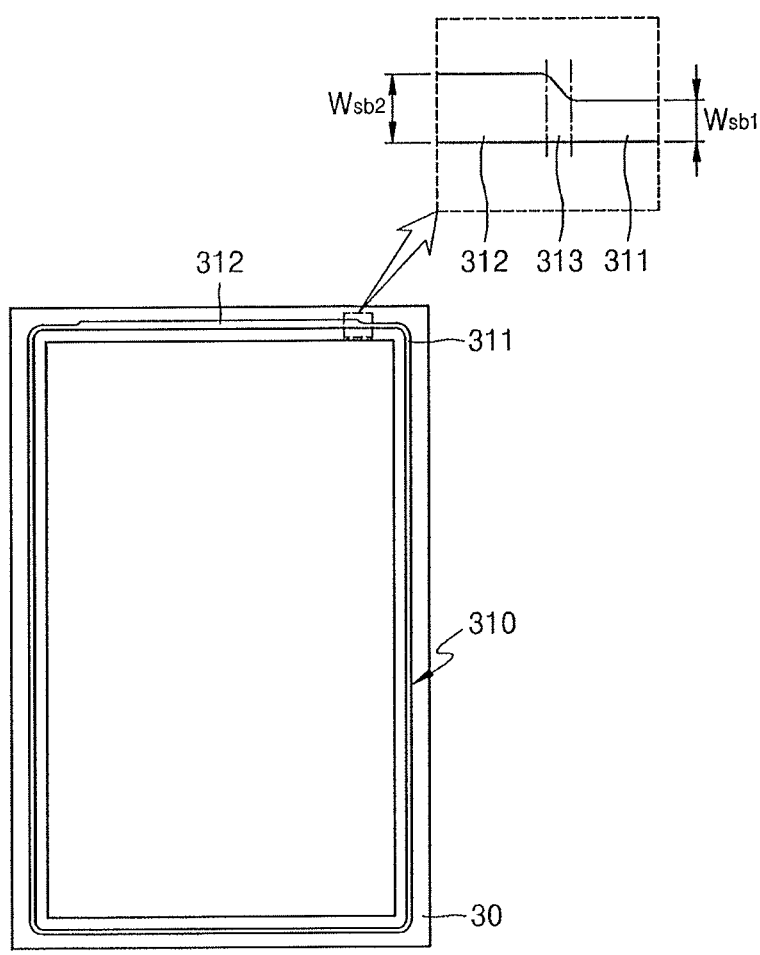

Referring to FIG. 7B, the sealing member 310 may be formed on the second substrate 30 to surround the display element 210. The sealing member 310 may include the first sealing portion 311 having a first forming width $W_{sb1}$ and the second sealing portion 312 having a second forming width $W_{sb2}$. The first forming width $W_{sb1}$ and the second forming width $W_{sb2}$ are respectively widths of the first sealing portion 311 and the second sealing portion 312 when the sealing member 310 is used to coat the second substrate 30 and before the sealing member 310 is melted by a laser beam.

The sealing member 310 may be formed such that the second forming width $W_{sb2}$ of the second sealing portion 312 is greater than the first forming width $W_{sb1}$ of the first sealing portion 311. The connection sealing portion 313 may include a portion whose width linearly or non-linearly increases in a direction away from the first sealing portion 311 toward the second sealing portion 312 in order to connect the first and second sealing portions 311 and 312.

A difference between the second forming width $W_{sb2}$ and the first forming width $W_{sb1}$ may range from about 3% to about 20% of the first forming width $W_{sb1}$. For example, when the first forming width $W_{sb1}$ is 630 μm, the second forming width $W_{sb2}$ may be 650 μm. As another example, when the first forming width $W_{sb1}$ is 420 μm, the second forming width $W_{sb2}$ may be 490 μm.

The sealing member 310 may be formed such that the second forming width $W_{sb2}$ is greater than the first forming width $W_{sb1}$ in consideration of a variation in the amount of heat that is transferred by the metal layer 250 to the sealing member 310 during a subsequent melting and curing process using a laser beam. A laser beam may be emitted to the sealing member 310 when the first and second substrates 20 and 30 are combined with each other, and thus the sealing member 310 may be melted to spread out. In this case, when a width of the metal layer 250 that overlaps with the sealing member 310 is greater, the amount of heat that is transferred to the sealing member 310 is greater, and the extent to which the sealing member 310 spreads may increase. When a width of the metal layer 250 that overlaps with the sealing member 310 is greater in the first sealing portion 311 than in the second sealing portion 312, the extent to which the sealing member 310 spreads may be greater in the first sealing portion 311 than in the second sealing portion 312. When the sealing member 310 is formed in consideration of this, the second forming width $W_{sb2}$ of the second sealing portion 312 may be greater than the first forming width $W_{sb1}$ of the first sealing portion 311.

Figure 7C:
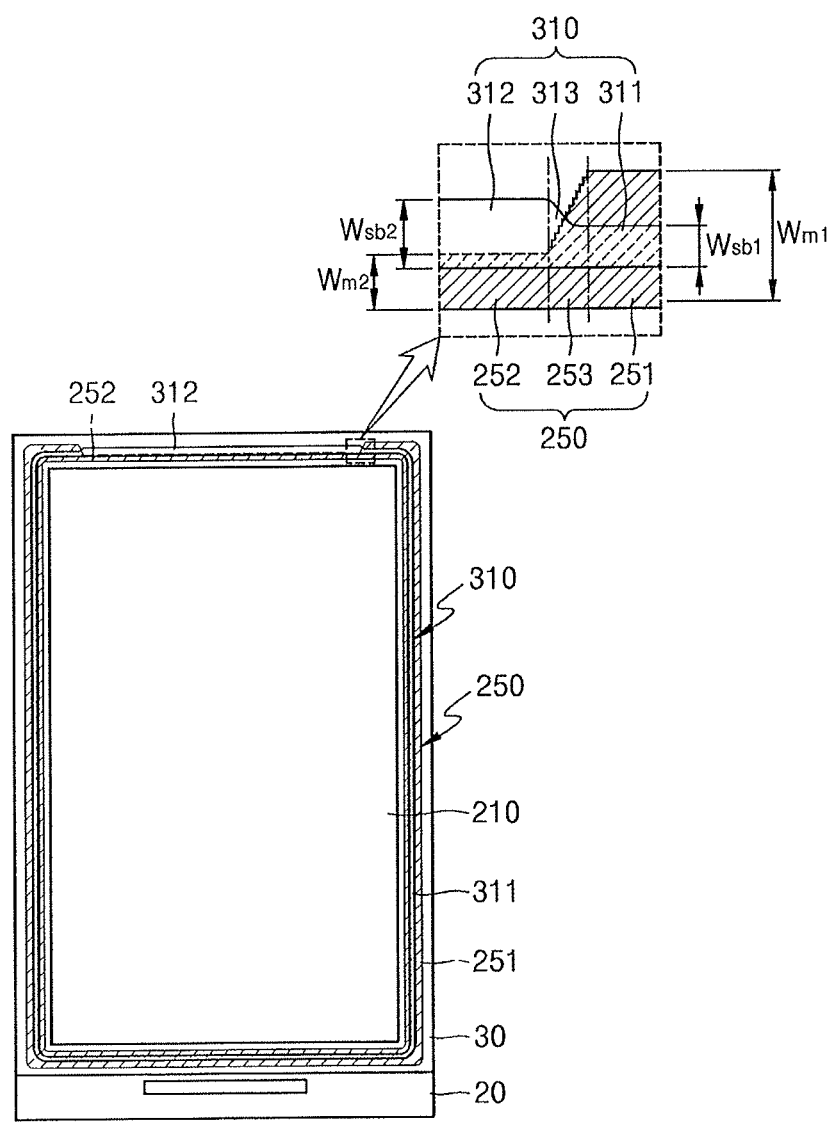

Referring to FIG. 7C, the first and second substrates 20 and 30 may be arranged such that the sealing member 310 that is formed on the second substrate 30 faces the first substrate 20, the first sealing portion 311 overlaps with the first portion 251, and the second sealing portion 312 overlaps with the second portion 252. The first forming width $W_{sb1}$ of the first sealing portion 311 may be less than the first width $W_{m1}$ of the first portion 251. The second forming width $W_{sb2}$ of the second sealing portion 312 may be greater than the second width $W_{m2}$ of the second portion 252.

A laser beam may be emitted to the sealing member 310 from the outside of the first substrate 20 in order to bond the first substrate 20 and the second substrate 30. As the laser beam is emitted, the sealing member 310 may be melted and then may be cured, thereby completing the bonding. Although it is described herein that a laser beam is emitted in order to melt and cure the sealing member 310, various modifications may be made to transfer heat to the sealing member 310. For example, in other implementations, the sealing member 310 may be melted and cured by putting the first and second substrates 20 and 30 with the sealing member 310 therebetween into a furnace that provides a high temperature environment.

Figure 7D:
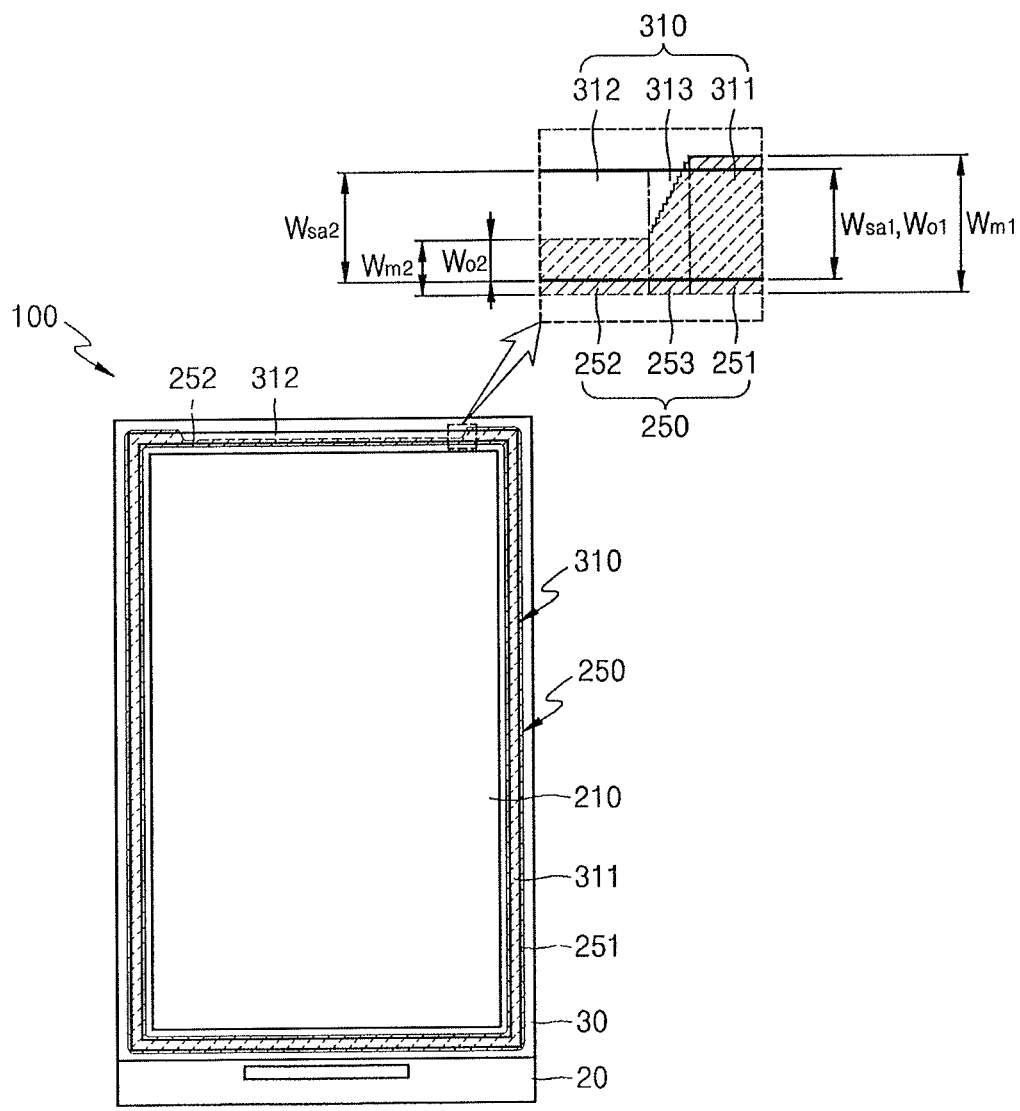

Referring to FIG. 7D, the first sealing portion 311 of the sealing member 310 that is completely cured may have the first sealing width $W_{sa1}$ and the second sealing portion 312 may have the second sealing width $W_{sa2}$. As the sealing member 310 is melted and cured, a width of the first sealing portion 311 may change from the first forming width $W_{sb1}$ of FIG. 7C to the first sealing width $W_{sa1}$ of 7D, and a width of the second sealing portion 312 may change from the second forming width $W_{sb2}$ of FIG. 7C to the second sealing width $W_{sa2}$ of FIG. 7D. The first sealing width $W_{sa1}$ may be greater than the first forming width $W_{sb1}$ and the second sealing width $W_{sa2}$ may be greater than the second forming width $W_{sb2}$.

When the first width $W_{m1}$ of the metal layer 250 is greater than the second width $W_{m2}$, a width of the first sealing portion 311 that overlaps with the first portion 251 may be greater than a width of the second sealing portion 312 that overlaps with the second portion 252. Accordingly, when the sealing member 310 is melted by using a laser beam, the extent to which the sealing member 310 spreads in a width direction may be greater in the first sealing portion 311 than in the second sealing portion 312. The amount of change from the forming width of the sealing member 310 to the sealing width of the sealing member 310 may be greater in the first sealing portion 311 than in the second sealing portion 312.

In consideration of a difference between the amount of change in a width of the first sealing portion 311 and the amount of change in a width of the second sealing portion 312, the sealing member 310 may be formed such that the second forming width $W_{sb2}$ of the second sealing portion 312 is greater than the first forming width $W_{sb1}$ of the first sealing portion 311. The amount of change in a width of the first sealing portion 311 may be greater than the amount of change in a width of the second sealing portion 312, but the forming width of the sealing member 310 may be less in the first sealing portion 311 than in the second sealing portion 312. Accordingly, the sealing width of the sealing member 310 may satisfy a predetermined range. The first sealing width $W_{sa1}$ of the first sealing portion 311 and the second sealing width $W_{sa2}$ of the second sealing portion 312 may be the same, or a difference therebetween may be equal to or less than 5% of the first sealing width $W_{sa1}$. Accordingly, a mechanical strength of the display module 100 and the display device 10 including the same may be increased.

If the forming width of the sealing member 310 were provided to be constant without considering the amount of change in a width of the sealing member 310, the extent to which the first sealing portion 311 and the second sealing portion 312 spread could be different from each other during a melting and curing process using a laser beam. Accordingly, the sealing width of the sealing member 310 may not be constant when the first and second substrates 20 and 30 are completely combined with each other. For example, a difference between the first sealing width $W_{sa1}$ of the first sealing portion 311 that overlaps with the first portion 251 and the second sealing width $W_{sa2}$ of the second sealing portion 312 that overlaps with the second portion 252 may exceed 5% of the first sealing width $W_{sa1}$. As such, when a difference between the first and second sealing widths $W_{sa1}$ and $W_{sa2}$ exceeds 5%, a stress could concentrate on a portion where there is the difference between the first and second sealing widths $W_{sa1}$ and $W_{sa2}$, thereby leading to damage to, or a crack in, the corresponding portion.

According to the present embodiment, the first forming width $W_{sb1}$ of the first sealing portion 311 may be less than the second forming width $W_{sb2}$ of the second sealing portion 312. Accordingly, the first sealing width $W_{sa1}$ and the second sealing width $W_{sa2}$ of the sealing member 310 that is completely cured may satisfy a predetermined range.

A width $W_{o1}$ of the first sealing portion 311 that overlaps with the first portion 251 of the metal layer 250 may be greater than a width $W_{o2}$ of the second sealing portion 312 that overlaps with the second portion 252 of the metal layer 250. A ratio $W_{o1}/W_{sa1}$ of the width $W_{o1}$ of the first sealing portion 311 that overlaps with the first portion 251 to the first sealing width $W_{sa1}$ of the first sealing portion 311 may be greater than a ratio $W_{o2}/W_{sa2}$ of the width $W_{o2}$ second sealing portion 312 that overlaps with the second portion 252 to the second sealing width $W_{sa2}$ of the second sealing portion 312.

Figure 8:
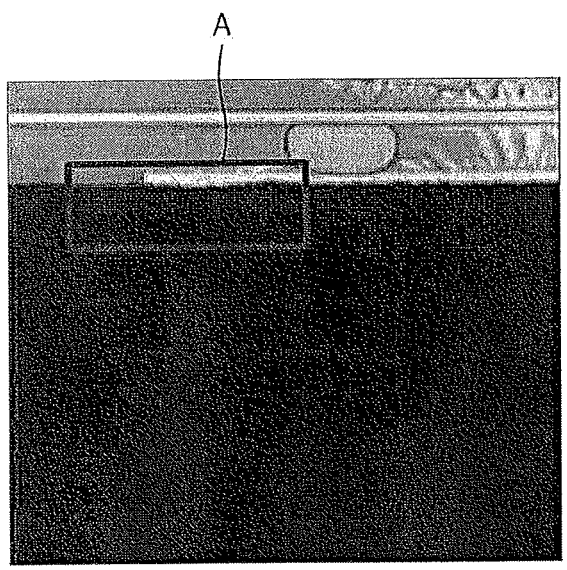
FIG. 8 illustrates an enlarged optical microscope image of a part of the display module of FIG. 7D.

FIG. 8 illustrates an enlarged optical microscope image of a part of the display module 100 of FIG. 7D. In FIG. 8, a dark portion indicates the sealing member 310 that was completely cured. In the sealing member 310 that was completely cured, there was little difference in a width at a portion A that connects the first sealing portion 311 and the second sealing portion 312. The sealing member 310 was formed such that the first forming width $W_{sb1}$ of the first sealing portion 311 was 630 μm and the second forming width $W_{sb2}$ of the second sealing portion 312 was 650 μm. A difference between the first sealing width $W_{sa1}$ of the first sealing portion 311 that was completely cured and the second sealing width $W_{sa2}$ of the second sealing portion 312 was greatly reduced. The difference between the first sealing width $W_{sa1}$ and the second sealing width $W_{sa2}$ was about 6 μm.

Figure 9:
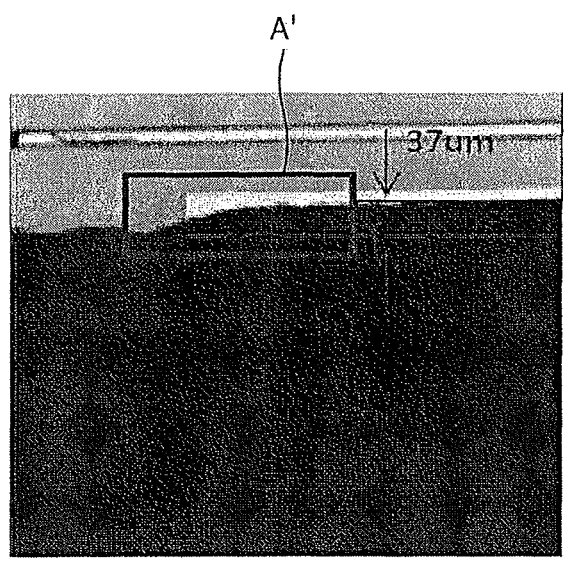
FIG. 9 illustrates an optical microscope image of the same part as that illustrated in FIG. 8 following completion of a curing process when both a first forming width of a first sealing portion and a second forming width of a second sealing portion were 610 μm.

FIG. 9 illustrates an optical microscope image of the same part as that illustrated FIG. 8 following completion of a curing process when both the first forming width $W_{sb1}$ of the first sealing portion 311 and the second forming width $W_{sb2}$ of the second sealing portion 312 were 610 μm, according to a comparative example. Referring to FIG. 9, in the sealing member 310 that was completely cured, there was a big difference in a width at a portion A' that connects the first sealing portion 311 and the second sealing portion 312. A difference between the first sealing width $W_{sa1}$ and the second sealing width $W_{sa2}$ was about 37 μm.

As illustrated in FIG. 9, when the sealing member 310 was formed such that the first sealing portion 311 and the second sealing portion 312 had the same width without considering a difference between the first width $W_{m1}$ and the second width $W_{m2}$ of the metal layer 250, the sealing width of the sealing member 310 that was completely cured was not constant. In contrast, when the sealing member 310 was formed according to embodiments such that the second forming width $W_{sb2}$ of the second sealing portion 312 was greater than the first forming width $W_{sb1}$ of the first sealing portion 311 in consideration of a difference between the first width $W_{m1}$ and the second width $W_{m2}$ of the metal layer 250, the sealing width of the sealing member 310 that was completely cured was shown to satisfy a predetermined range.

Figure 10A:
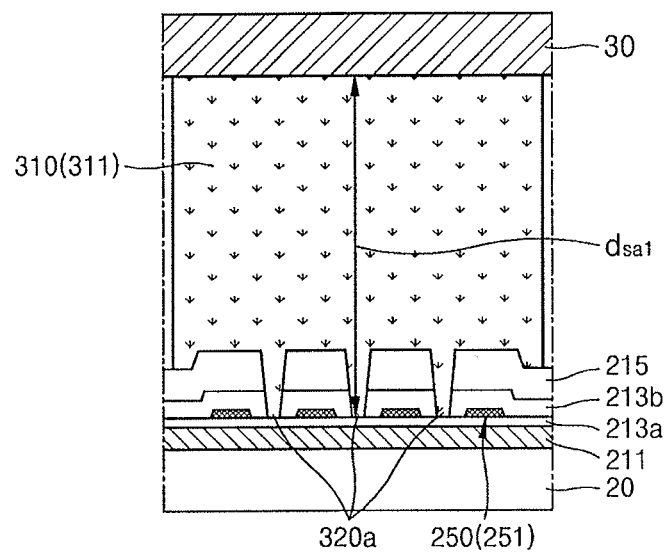
FIG. 10A illustrates a cross-sectional view depicting the first sealing portion of FIG. 7D, taken in a thickness direction.
Figure 10B:
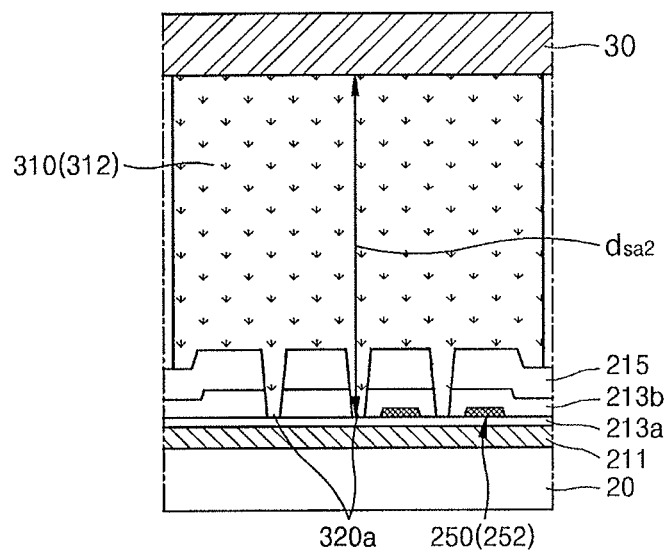
FIG. 10B illustrates a cross-sectional view depicting the second sealing portion of FIG. 7D, taken in the thickness direction.

FIG. 10A illustrates a cross-sectional view depicting the first sealing portion 311 of FIG. 7D, taken in a thickness direction. FIG. 10B illustrates a cross-sectional view depicting the second sealing portion 312 of FIG. 7D, taken in the thickness direction.

Referring to FIG. 10A, the first sealing portion 311 may overlap with the first portion 251 of the metal layer 250 and may have a first sealing thickness $d_{sa1}$. Referring to FIG. 10B, the second sealing portion 312 may overlap with the second portion 252 of the metal layer 250 and may have a second sealing thickness $d_{sa2}$.

A thickness of the sealing member 310 may change during a melting and curing process using a laser beam. For example, a forming thickness of the sealing member 310 when the sealing member 310 is formed on the second substrate 30 may be less than a sealing thickness of the sealing member 310 when the first and second substrates 20 and 30 are combined with each other during a melting and curing process using a laser beam. The term 'forming thickness' used herein refers to a thickness of the sealing member 310 when the sealing member 310 is formed on the second substrate 30 and before a laser beam is emitted, and the term 'sealing thickness' refers to a thickness of the sealing member 310 when the laser beam has been emitted and a melting and curing process has been completed.

As described above, the amount of change in a width may vary according to the amount of the sealing member 310 that overlaps with the metal layer 250. A width of the first sealing portion 311 that overlaps with the metal layer 250 may be greater than a width of the second sealing portion 312 that overlaps with the metal layer 250. Accordingly, the extent to which a width spreads during a melting and curing process using a laser beam may be greater in the first sealing portion 311 than in the second sealing portion 312. As the extent to which a width spreads increases, the amount of reduction in a thickness of the first sealing portion 311 may be greater than the amount of reduction in a thickness of the second sealing portion 312. Hence, when the first sealing portion 311 and the second sealing portion 312 are formed to have the same thickness, the first sealing thickness $d_{sa1}$ of the first sealing portion 311 may be less than the second sealing thickness $d_{sa2}$ of the second sealing portion 312.

Figure 11A:
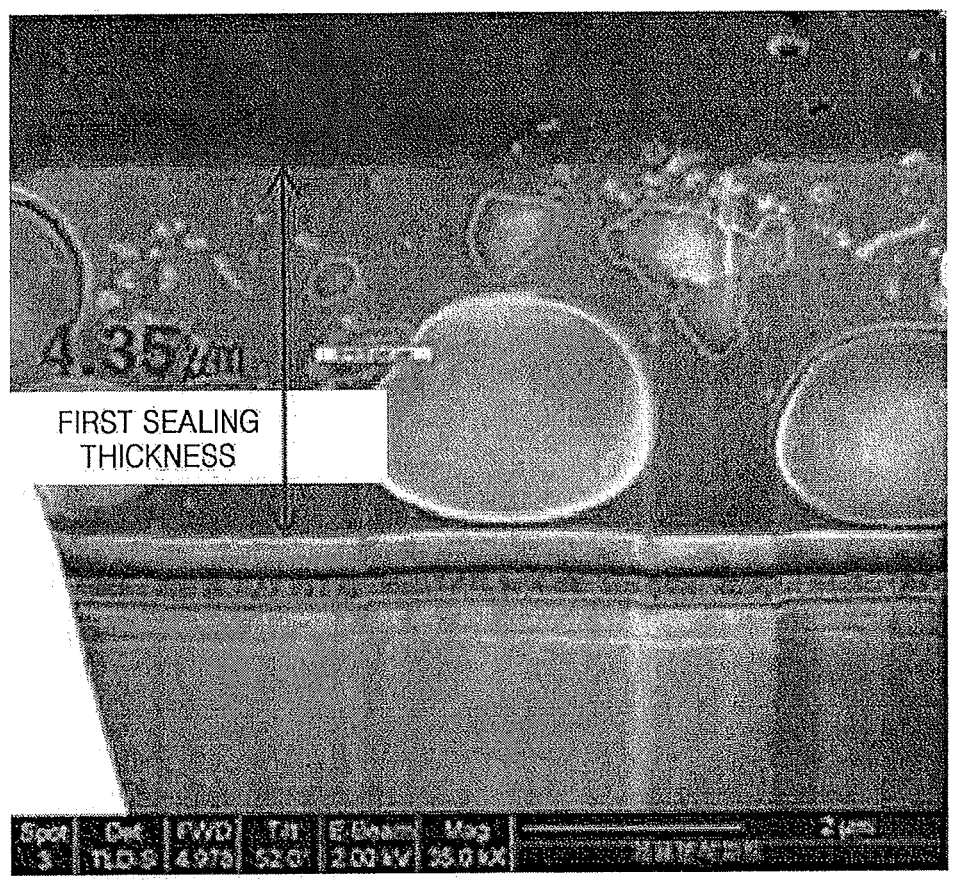
FIGS. 11A and 11B illustrate electron microscope images depicting the first sealing portion and the second sealing portion of the display module, taken in the thickness direction.
Figure 11B:
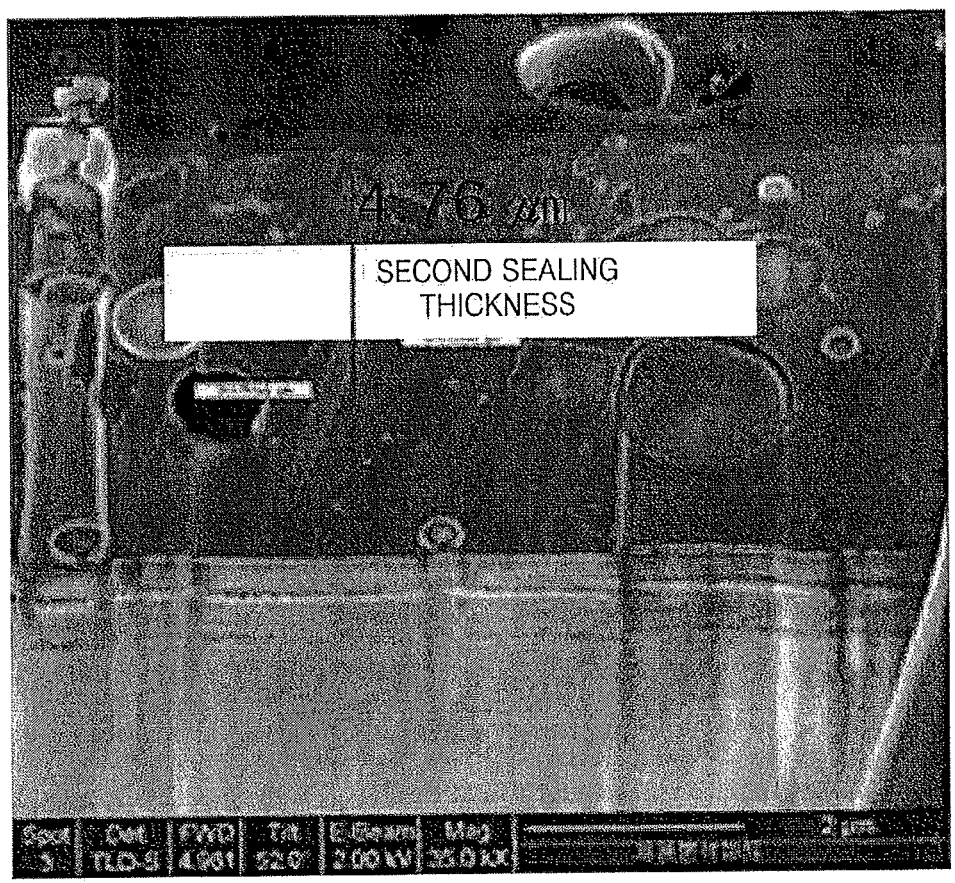

FIGS. 11A and 11B illustrate electron microscope images of the first sealing portion 311 and the second sealing portion 312 of the display module 100, taken in the thickness direction. The first and second sealing portions 311 and 312 of FIGS. 11A and 11B may be formed to have the same thickness, and then may be completely cured by using a laser beam.

Referring to FIGS. 11A and 11B, the first sealing thickness $d_{sa1}$ of the first sealing portion 311 that was completely cured was 4.35 μm and the second sealing thickness $d_{sa2}$ of the second sealing portion 312 that was completely cured as 4.76 μm. A difference between the first sealing thickness $d_{sa1}$ and the second sealing thickness $d_{sa2}$ was 0.41 μm (=4.76 μm–4.35 μm).

A difference between the first sealing thickness $d_{sa1}$ and the second sealing thickness $d_{sa2}$ may range from about 5% to about 15% of the first sealing thickness $d_{sa1}$. When a difference between the first sealing thickness $d_{sa1}$ and the second sealing thickness $d_{sa2}$ exceeds 15%, bonding characteristics may degrade. On the other hand, when a thickness difference is equal to or less than 15%, bonding characteristics may not be affected.

Figure 12A:
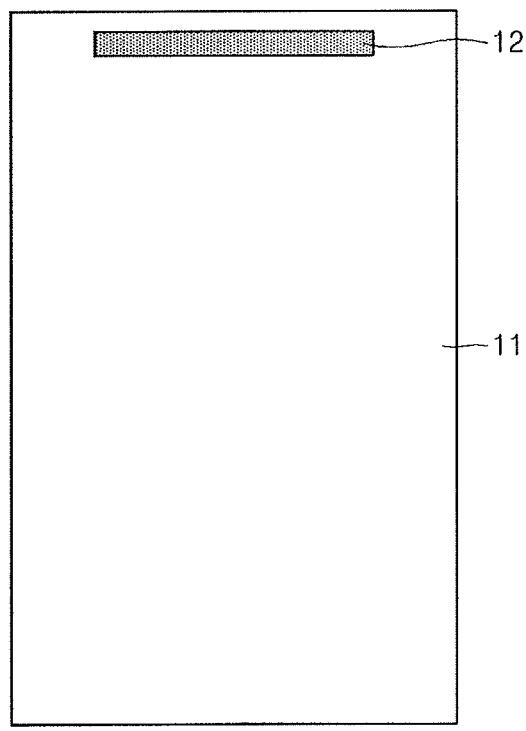
FIGS. 12A and 12B illustrate plan views depicting stages of a method of manufacturing the display device including the display module of FIG. 1.
Figure 12B:
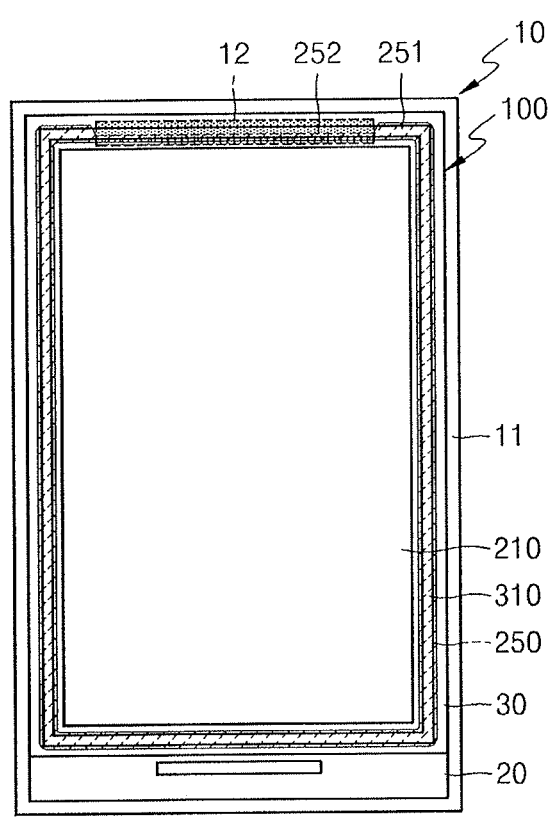

FIGS. 12A and 12B are plan views of stages of a method of manufacturing the display device 10 including the display module 100 of FIG. 1.

Referring to FIG. 12A, the antenna 12 may be disposed in the housing 11. The housing 11 that forms an outer appearance of the display device 10 may be a single member. In other implementations, the housing 11 may include a plurality of members that may be coupled to one another.

The number of the antennas 12 disposed in the housing 11 may be one, or two or more. The antenna 12 for transmitting and/or receiving a wireless signal may be formed by using single or multi-band antennas. Examples of communication bands that may be covered by the antenna 12 include cellular phone bands (e.g., 850 MHz, 900 MHz, 1800 MHz, 1900 MHz, or 2100 MHz bands), satellite navigation bands (e.g., 1575 MHz bands for satellite positioning systems), wireless local area network bands (e.g., 2.4 GHz or 5 GHz bands for IEEE 802.11 (WiFi®)), and Bluetooth bands (e.g., 2.4 GHz bands). Examples of the antennas that may be used for the antenna 12 in the housing 11 include monopole antennas, dipole antennas, strip antennas, patch antennas, inverted-F antennas, coil antennas, planar inverted-F antennas, open slot antennas, closed slot antennas, loop antennas, hybrid antennas including a plurality of types of antennas, and other appropriate antennas.

Referring to FIG. 12B, the display module 100 may be disposed in the housing 11 to cover the antenna 12. The display module 100 may be disposed so that at least a part of the antenna 12 overlaps with the second portion 252 of the metal layer 250. The second portion 252 has the second width $W_{m2}$ that is less than the first width $W_{m1}$. Accordingly, even when the metal layer 250 overlaps with the antenna 12, a reception sensitivity of the antenna 12 may be prevented from being reduced.

By way of summation and review, a display module may be sealed in order to protect internal display elements from the outside. To this end, a plurality of substrates may be combined together by forming a sealing member between the plurality of substrates and curing the sealing member using a laser beam A display module, a display device, and a method of manufacturing the same according to the present invention may, maintain a reception sensitivity of an antenna and may increase a bonding strength between a first substrate and a second substrate by using a sealing member. Accordingly, the impact resistance of the display module and the display device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
 a housing;
 at least one antenna that is disposed in the housing; and
 a display module that is disposed in the housing so as to cover the antenna,
 wherein the display module includes:
  a first substrate on which a display element is located;
  a second substrate that faces the first substrate;
  a metal layer that is on the first substrate so as to surround the display element, the metal layer including a first portion having a first width and a second portion having a second width that is less than the first width; and
  a sealing member that is between the first substrate and the second substrate and surround the display element, the sealing member including a first sealing portion that overlaps with the first portion of the metal layer and has a first sealing width and a second sealing portion that overlaps with the second portion of the metal layer and has a second sealing width,
 wherein a difference between the first sealing width and the second sealing width of the display module is equal to or less than 5% of the first sealing width, and
 wherein at least a part of the at least one antenna overlaps with the second portion of the metal layer.

2. The display device as claimed in claim 1, wherein:
 the first and second sealing portions respectively have first and second sealing thicknesses in a direction from the first substrate to the second substrate, and
 the first sealing thickness of the first sealing portion is less than the second sealing thickness of the second sealing portion.

3. The display device as claimed in claim 1, wherein a ratio of a width of the first sealing portion that overlaps with the first portion of the metal layer to the first sealing width of the first sealing portion is greater than a ratio of a width of the second sealing portion that overlaps with the second portion of the metal layer to the second sealing width of the second sealing portion.

4. The display device as claimed in claim 1, wherein:
 the metal layer further includes a connection portion that connects the first portion and the second portion, and
 a width of at least a part of the connection portion varies.

5. The display device as claimed in claim 1, wherein respective widths of the first portion and the second portion are constant.

6. A display module, comprising:
 a first substrate on which a display element is located;
 a second substrate that faces the first substrate;
 a metal layer that is on the first substrate so as to surround the display element, the metal layer including a first portion having a first width and a second portion that is connected to the first portion, has a second length that extends in a first direction, and has a second width in a second direction perpendicular to the first direction that is less than both the second length and the first width; and a sealing member that is between the first substrate and the second substrate so as to surround the display element, the sealing member including a first sealing portion that overlaps with the first portion of the metal layer and has a first sealing width and a second sealing portion that overlaps with the second portion of the metal layer, has a second sealing length that extends in the first direction, and has a second sealing width in the second direction that is less than the second sealing length, wherein a difference between the first sealing width and the second sealing width is equal to or less than 5% of the first sealing width.

7. The display module as claimed in claim 6, wherein:

the first and second sealing portions respectively have first and second sealing thicknesses in a third direction from the first substrate to the second substrate, and the first sealing thickness of the first sealing portion is less than the second sealing thickness of the second sealing portion.

8. The display module as claimed in claim 6, wherein a ratio of a width of the first sealing portion that overlaps with the first portion of the metal layer to the first sealing width of the first sealing portion is greater than a ratio of a width of the second sealing portion that overlaps with the second portion of the metal layer to the second sealing width of the second sealing portion.

9. The display module as claimed in claim 6, wherein:

the metal layer further includes a connection portion that connects the first portion of the metal layer and the second portion of the metal layer, and a width of at least a part of the connection portion varies.

10. The display module as claimed in claim 9, wherein the connection portion has a third length that extends in the first direction, and wherein the width of the part of the connection portion is in the second direction and is less than the third length.

11. The display module as claimed in claim 10, wherein the first portion of the metal layer has a first length that extends in the first direction, and wherein the first width extends in the second direction and is less than the first length.

12. The display module as claimed in claim 9, wherein the connection portion and the second portion of the metal layer have a same width in the second direction where they are connected.

13. The display module as claimed in claim 9, wherein the width of the part of the connection portion is a width in the second direction.

14. The display module as claimed in claim 6, wherein respective widths of the first portion of the metal layer and the second portion of the metal layer are constant.

15. The display module as claimed in claim 6, wherein the first portion of the metal layer has a first length that extends in the first direction, and wherein the first width extends in the second direction and is less than the first length.

16. A display module, comprising:

a first substrate on which a display element is located;

a second substrate that faces the first substrate;

a metal layer that is on the first substrate so as to completely surround the display element, the metal layer including a first portion having a first width and a second portion that is connected to the first portion and has a second width that is less than the first width; and a sealing member that is between the first substrate and the second substrate so as to surround the display element, the sealing member including a first sealing portion that overlaps with the first portion of the metal layer and has a first sealing width and a second sealing portion that overlaps with the second portion of the metal layer and has a second sealing width, wherein a difference between the first sealing width and the second sealing width is equal to or less than 5% of the first sealing width.

* * * * *